US011211117B2

(12) United States Patent
Loving et al.

(10) Patent No.: US 11,211,117 B2
(45) Date of Patent: Dec. 28, 2021

(54) FERRIMAGNETIC/FERROMAGNETIC EXCHANGE BILAYERS FOR USE AS A FIXED MAGNETIC LAYER IN A SUPERCONDUCTING-BASED MEMORY DEVICE

(71) Applicants: Melissa G. Loving, College Park, MD (US); Thomas F. Ambrose, Crownsville, MD (US)

(72) Inventors: Melissa G. Loving, College Park, MD (US); Thomas F. Ambrose, Crownsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/256,547

(22) Filed: Jan. 24, 2019

(65) Prior Publication Data
US 2020/0243132 A1 Jul. 30, 2020

(51) Int. Cl.
*G11C 11/44* (2006.01)
*H01L 39/22* (2006.01)
(Continued)

(52) U.S. Cl.
CPC ............. *G11C 11/44* (2013.01); *H01L 27/18* (2013.01); *H01L 39/025* (2013.01); *H01L 39/12* (2013.01);
(Continued)

(58) Field of Classification Search
CPC ....... G11C 11/44; H01L 39/223; H01L 39/12; H01L 39/025; H01L 39/2493; H01L 27/18
(Continued)

(56) References Cited

U.S. PATENT DOCUMENTS 6,710,986 B1    3/2004  Sato et al.
7,252,852 B1 *  8/2007  Parkin ................... B82Y 25/00
                                                    257/E43.006
(Continued)

FOREIGN PATENT DOCUMENTS

JP      H076329 A     1/1995
JP      H09128970 A   5/1997
(Continued)

OTHER PUBLICATIONS

E kit, Y Hata, K Yano, H Suzuki, G Kido. "Experimental determination of inter-sublattice exchange constants in amorphous FeGd alloys." Journal of Applied Physics 95.11 (2004): 6834-6836.
(Continued)

*Primary Examiner* — Tha-O H Bui
(74) *Attorney, Agent, or Firm* — Tarolli, Sundheim, Covell & Tummino LLP

(57) ABSTRACT

A magnetic Josephson junction (MJJ) device having a ferrimagnetic/ferromagnetic (FIM/FM) exchange-biased bilayer used as the magnetic hard layer improves switching performance by effectively sharpening the hysteresis curve of the device, thereby reducing error rate when the device is used in a Josephson magnetic random access memory (JM-RAM) memory cell. Thus, the materials and devices described herein can be used to build a new type of MJJ, termed a ferrimagnetic Josephson junction (FIMJJ), for use in JMRAM, to construct a robust and reliable cryogenic computer memory that can be used for high-speed superconducting computing, e.g., with clock speeds in the microwave frequency range.

20 Claims, 10 Drawing Sheets

(51) Int. Cl.
H01L 27/18 (2006.01)
H01L 39/12 (2006.01)
H01L 39/24 (2006.01)
H01L 39/02 (2006.01)

(52) U.S. Cl.
CPC ........ *H01L 39/223* (2013.01); *H01L 39/2493* (2013.01)

(58) Field of Classification Search
USPC .......................................................... 365/162
See application file for complete search history.

(56) References Cited

U.S. PATENT DOCUMENTS

| | | | |
|---|---|---|---|
| 8,270,209 | B2 | 9/2012 | Herr et al. |
| 9,208,861 | B2 | 12/2015 | Herr et al. |
| 9,214,624 | B2 | 12/2015 | Lee et al. |
| 9,251,057 | B2 | 2/2016 | Higo et al. |
| 9,656,682 | B2 | 5/2017 | Ahlemeier |
| 2015/0043273 | A1* | 2/2015 | Naaman ............... G11C 11/1675 365/162 |
| 2020/0028512 | A1 | 1/2020 | Reohr et al. |
| 2020/0075093 | A1* | 3/2020 | Naaman ................... H03K 3/38 |

FOREIGN PATENT DOCUMENTS

| | | |
|---|---|---|
| JP | 2000090009 A | 3/2000 |
| JP | 2000091665 A | 3/2000 |
| JP | 2003318465 A | 11/2003 |
| JP | 2016535383 A | 11/2016 |

OTHER PUBLICATIONS

EA Nesbitt, JH Wernick, E Cobenzwit. "Magnetic moments of alloys and compounds of iron and cobalt with rare earth metal additions." Journal of applied physics 30.3 (1959): 365-367.

F Canet, S Mangin, C Bellouard, M Piechuch, A Schuhl. "Exchange bias in ferrimagnetic based bilayers." Journal of Applied Physics 89.11 (2001): 6916-6918.

F Hellman, RB van Dover, EM Gyorgy. "Unexpected unidirectional anisotropy in amorphous Tb—Fe/Ni—Fe—Mo bilayer films." Applied Physics Letters 50.296 (1987).

I M Dayton, T Sage, E C Gingrich, M G Loving, T F Ambrose, N P Siwak, S Keebaugh, C Kirby, D L Miller, A Y Herr, Q P Herr, O Naaman. "Experimental demonstration of a Josephson magnetic memory cell with a programmable p-junction." IEEE Magnetics Letters (2018).

K Yano, E Kita, H Ino, A Tasaki. "Magnetic properties of amorphous Fe100—xGdx (18×70) alloys." IEEE Translation Journal on Magnetics in Japan 7.12 (1992): 943-947.

M. G. Loving, T. F. Ambrose, H. Ermer, D. Miller, O. Naaman. "Interplay between interface structure and magnetism in MiFe/Cu/Ni-based pseudo-spin valves." AIP Advances 8.5 (2018): 056309.

NJ Oliveira, JL Ferreira, J Pinheiro, AM Fernandes, O Redon, SX Li, P ten Berge, TA Plaskett, PP Freitas. "Improvement of thermal stability and magnetoresistance recovery of Tb25Co75 biased spin-valve heads." Journal of Applied Physics 81.5 (1997): 4903-4905.

PP Freitas, JL Leal, LV Melo, NJ Oliveira, L Rodrigues, AT Sousa. "Spin-valve sensors exchange-biased by ultrathin TbCo films." Applied Physics Letters 65.4 (1994): 493-495.

PP Freitas, JL Leal, TS Plaskett, LV Melo, JC Soares. "Spin-valve exchange biased with a-TbCo layers." Journal of Applied Physics 75.10 (1994): 6480.

R C Vickery, W C Sexton, V Novy, E V Kleber. "Magneto Structural Sudies on Gadolinium-Iron Alloys." Journal of Applied Physics (1968): 366s.

Schroder, J Orehotsky and K. "Magnetic properties of amorphous FexGdy alloy thin films." Journal of Applied Physics 43.5 (1972): 2413-2418.

WC Cain, MH Kryder. "Investigation of the exchange mechanism in NiFe—TbCo bilayers." Journal of Applied Physics 67.9 (1990): 5722-5724.

International Search Report for International Application No. PCT/US2020/017944 dated Jun. 29, 2020.

Tahara S et al: "Vortex Transitional Non-Destructive Read-Out Josephson Memory Cell",NEC Research and Development, Nippon Electric Ltd. Tokyo, JP'vol. 34, No. 4, Oct. 1, 1993 (Oct. 1, 1993), pp. 415-423, XP000424442, ISSN: 0547-051X A paragraph [0002]; figure 1.

International Search Report for international Application No. PCT/US2019/046138 dated Jul. 21, 2020.

Japanese Office Action for Patent Application No. 2019-544849 dated Jul. 10, 2020.

* cited by examiner

FERRIMAGNETIC/FERROMAGNETIC EXCHANGE BILAYERS FOR USE AS A FIXED MAGNETIC LAYER IN A SUPERCONDUCTING-BASED MEMORY DEVICE

TECHNICAL FIELD

The present invention relates generally to superconducting circuit devices, and specifically to ferrimagnetic/ferromagnetic exchange bilayers for use as a fixed magnetic layer in a superconducting-based memory device.

BACKGROUND

Superconducting electronics can be implemented to provide high-performance computing with low energy consumption. Superconducting Josephson junctions with magnetic barriers, also referred to as magnetic Josephson junctions (MJJs), can serve as the basis for Josephson magnetic random access memory (JMRAM), as disclosed in U.S. Pat. No. 8,270,209 B2, entitled "Josephson Magnetic Random Access Memory System and Method," which is herein incorporated by reference. JMRAM relies on the oscillation of the relative Cooper pair phase with magnetic layer thickness to produce junctions that exhibit a Josephson phase of either zero or $\pi$, depending on the relative magnetic layer orientation. This binary phase switchability can be exploited to create superconducting memory elements capable of storing a logical "0" or logical "1" state. Memory unit elements can be arranged in arrays with read and write lines to create an addressable memory fabricated, for example, on an integrated circuit (IC) chip that can be cooled to cryogenic temperatures (e.g., around four kelvins).

SUMMARY

One example includes an improved magnetic Josephson junction (MJJ) device having a magnetic bilayer in place of the fixed magnetic layer, the bilayer having a ferrimagnet. The MJJ device has a first superconducting material layer and a second superconducting material layer each configured as a galvanic contact for the device on respective top and bottom ends of the device. The MJJ device further has a first magnetic layer and a magnetic bilayer comprising a second magnetic layer and an adjacent third magnetic layer, both the first magnetic layer and the magnetic bilayer being located between the first and second superconducting material layers, the third magnetic layer being a ferrimagnet. The MJJ device further has a normal metal spacer layer between the first magnetic layer and the magnetic bilayer. The MJJ device is configured to store a binary logical value as a magnetic orientation of the first magnetic layer with reference to the magnetic orientation of the second magnetic layer.

Another example includes a superconducting memory element having first and second superconducting wires providing galvanic input and output to the memory element, first and second field lines providing inductive memory state write input to the memory element, and a magnetic Josephson junction (MJJ) arranged between and connecting the wires. The MJJ has a free ferromagnetic layer and a fixed ferromagnetic layer that together can occupy one of a parallel or antiparallel magnetization configuration corresponding to a binary logic state. The MJJ has a ferrimagnetic layer adjacent to and magnetically coupled to the fixed ferromagnetic layer.

Yet another example includes a method of fabricating an improved magnetic Josephson junction. A base electrode layer of a superconducting material is deposited, followed by depositing a first buffer layer on top of the base electrode layer. One of a switching free magnetic layer comprising a first magnetic layer or a fixed magnetic layer comprising a magnetic bilayer on top of the first buffer layer is then deposited on the first buffer layer. The first magnetic layer comprises a ferromagnetic material and the magnetic bilayer comprises a ferromagnetic material layer and a ferrimagnetic material layer. A spacer layer is then deposited on top of the switching magnetic layer or the fixed magnetic layer, and the other of the switching magnetic layer or the fixed magnetic layer is then deposited on top of the spacer layer. A second buffer layer is deposited on top of the other of switching magnetic layer or the fixed magnetic layer, and a top electrode layer of a superconducting material is deposited on top of the second buffer layer.

DETAILED DESCRIPTION

Figure 1A:
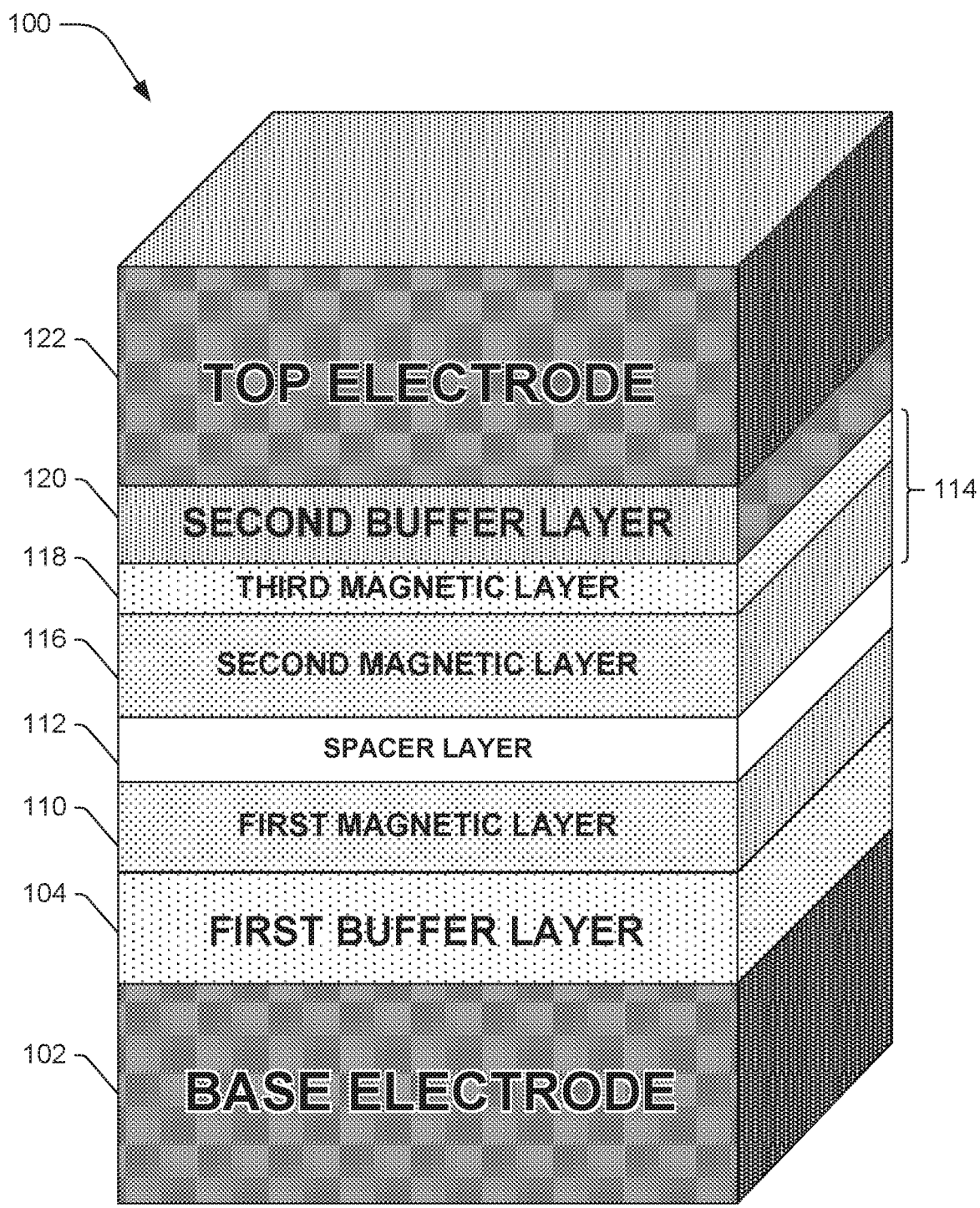
FIGS. 1A-1D are layer diagrams of example layer structures of a superconducting ferrimagnetic Josephson junction (FIMJJ) device.

A magnetic Josephson junction (MJJ) device having a ferrimagnetic/ferromagnetic (FIM/FM) exchange-biased bilayer used as the magnetic hard layer (instead of, for example, a unitary ferromagnetic layer) improves switching performance by effectively sharpening the hysteresis curve of the device, thereby reducing error rate when the device is used in a Josephson magnetic random access memory (JMRAM) array. Thus, the materials and devices described herein can be used to build a new type of MJJ, what is herein termed a ferrimagnetic Josephson junction (FIMJJ), for use in JMRAM, to construct a robust and reliable cryogenic computer memory that can be used for high-speed superconducting computing, e.g., with clock speeds in the microwave frequency range.

An MJJ is similar to a magnetic tunnel junction (MTJ) used in a non-superconducting magnetoresistive random-access memory (MRAM) cell in that it has a free magnetic layer capable of writing a magnetic state and a fixed magnetic layer used to reference the written magnetic state. Accordingly, the respective orientations of the layers represent one of two binary states: an antiparallel orientation of the magnetic layers with respect to each other can be used to represent, e.g., a logical "0", whereas, when the orientation is reversed using a magnetic field, a resultant parallel orientation of the magnetic layers with respect to each other can be used to represent, e.g., a logical "1". An MJJ-based memory differs from non-superconducting MRAM in both operating temperature (the MJJ being configured to operate at the cryogenic temperatures characteristic of superconducting circuits) as well as the use of superconducting material (e.g., niobium) as its contact layers. Additionally, in a non-superconducting MRAM cell, readback is performed via a resistance measurement, whereas readback of an MJJ is based on detecting the superconducting phase of the memory cell.

Construction of reliable memories using MJJs has posed challenges in optimizing simultaneously the magnetics and superconductivity of the MJJ devices. Many configurations that appear to be optimized magnetically show suboptimal performance as superconductors, and vice-versa. A major challenge is that the fixed magnetic layer that serves as the hard magnetic phase of the MJJ structure may not switch well, and can couple to the free magnetic layer such that the free magnetic layer does not switch coherently. The presently described materials and devices address this dual problem with the interaction of the two magnetic layers by replacing the fixed magnetic layer of an MJJ, e.g., implemented as a simple nickel layer, with an FIM/FM bilayer, e.g., comprising a nickel-iron layer magnetically coupled to a ferrimagnet.

Like an antiferromagnetic material, a ferrimagnetic material has populations of atoms with opposing magnetic moments, but unlike in an antiferromagnetic material, when the populations consist of different materials or ions, the opposing moments are unequal and a spontaneous magnetization remains in a ferrimagnetic material, such that the magnetization of a ferrimagnetic material is unbalanced greater than zero. Ferrimagnets thus differ from antiferromagnets in that, although they exhibit an antiparallel coupling structure of the spin magnetic state (compare, e.g., FIG. 2B to FIG. 2C), ferrimagnets have an uncompensated moment. When a ferrimagnetic layer is implemented as part of a magnetic bilayer as described herein, this uncompensated moment can permit maintenance of a superconducting critical current through an MJJ layer stack while also improving the fixedness of the fixed magnetic layer as well as improving coherent switching in the free magnetic layer of the MJJ stack.

Similar to ferromagnetic materials, ferrimagnetic materials exhibit a spontaneous and net magnetization at room temperature, consist of magnetically saturated domains, and exhibit magnetic hysteresis. Ferrimagnetic materials also have an additional compensation temperature $T_{comp}$ at which the total magnetization is zero due to balancing of the two spin lattices, and above which the ferrimagnetic materials become paramagnetic or non-magnetic at their individual Curie temperatures $T_C$. Unlike conventional ferromagnetic materials, ferrimagnetic materials typically exhibit a compensation temperature $T_{comp}$ corresponding to each ferromagnetic material in the binary system and a spin-flip transition at high magnetic fields.

FIG. 1A shows an example layer structure of a ferrimagnetic Josephson junction (FIMJJ) device 100 with a ferrimagnetic (FIM)/ferromagnetic (FM) exchange-biased layer as a magnetic hard layer. Device 100 has a barrier between two galvanic terminals, that, in accordance with the provision of appropriate control inputs, switches between magnetic alignment states respectively representative of binary logical values "0" and "1" and is readable for those states when implemented in a memory cell. As shown, example FIMJJ device 100 consists of at least base and top electrode layers 102, 122 each made of a superconducting material, and, in between the electrode layers, a first magnetic layer 110 and a bilayer 114 of second and third magnetic materials 116, 118. First and second buffer layers 104, 120 can separate the magnetic layers 110, 114 from the respective superconducting-material electrodes 102, 122. A normal-metal spacer layer 112 can separate the magnetic layers 110, 114 from each other. As illustrated, first magnetic layer 110 serves as a "free" or "switching" layer fabricated using soft magnetic materials with relatively low magnetic coercivity, and magnetic bilayers 114 serves as a "fixed" layer fabricated with a ferromagnetic material as second magnetic layer 116 coupled to third magnetic layer 118 consisting of a ferrimagnet. Together, the illustrated layers can form a pillar that can be on the order of one micrometer by one micrometer in size, typically elliptical in shape, when viewed in a plan view.

Figures 1B, 1C, 1D:
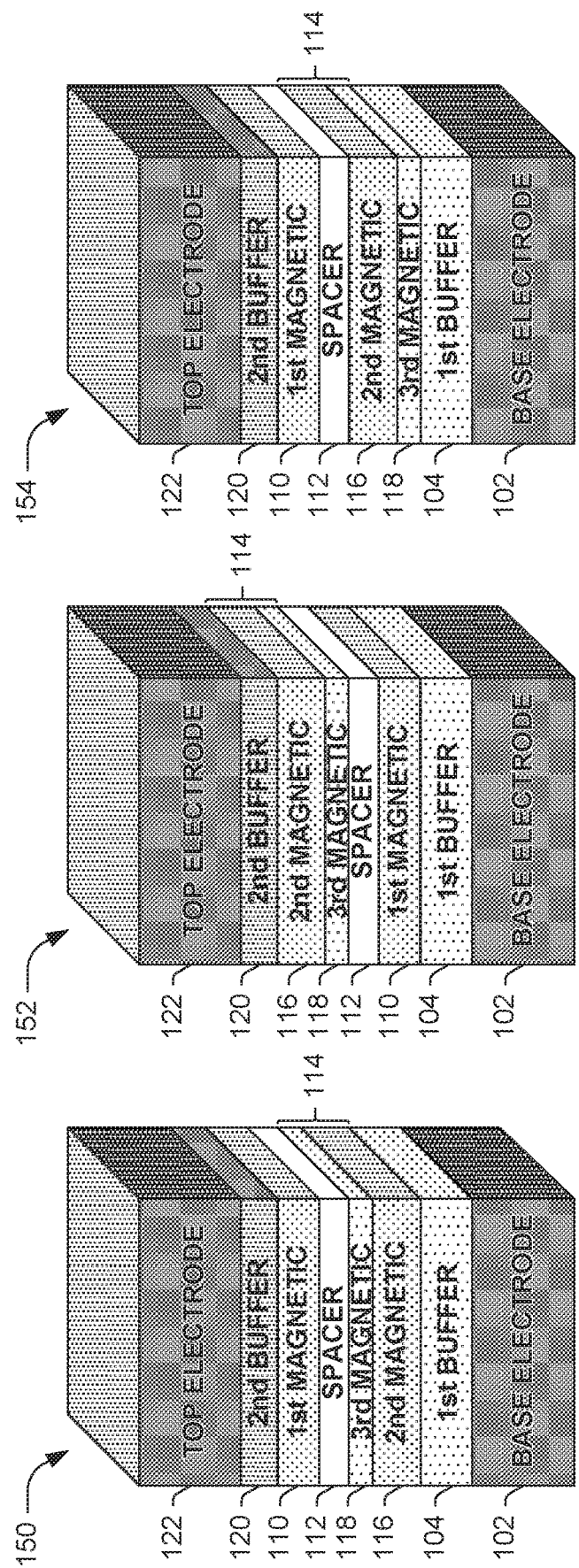

FIGS. 1B, 1C, and 1D illustrate alternative example layer arrangements. In device 150 of FIG. 1B, as compared to device 100 of FIG. 1A, first magnetic layer 110 and magnetic bilayer 114 swap positions in the stack 150, i.e., with bilayer 114 below spacer layer 112 and first magnetic layer 110 above spacer layer 112. In device 152 of FIG. 1C, as compared to device 100 of FIG. 1A, within bilayer 114, second magnetic layer 116 and third magnetic layer 118 swap positions in the stack 152, i.e., with third magnetic layer 118 below second magnetic layer 116. Similarly in device 154 of FIG. 1D, as compared to device 150 of FIG. 1B, within bilayer 114, second magnetic layer 116 and third magnetic layer 118 swap positions in the stack 154, i.e., with third magnetic layer 118 below second magnetic layer 116. In any of the four example layer arrangements 100, 150, 152, 154, irrespective of the relative positioning of the magnetic layers, the first magnetic layer 110 is separated from the bilayer 114 by spacer layer 112, and the two layers of the bilayer 114, i.e., layers 116 and 118, are adjacent to each other.

Electrodes 102, 122 can be fabricated of a superconducting material, e.g., niobium, niobium nitride, or aluminum. As an example, base electrode 102 can have a thickness of between about one hundred nanometers and about two hundred nanometers, e.g., about one hundred fifty nanometers, and top electrode 122 can have a thickness of between about twenty nanometers and about one hundred nanometers, e.g., about fifty nanometers. First buffer layer 104 can be included as a single nonmagnetic layer to smooth out roughness in the superconductor layer 102. As an example, first buffer layer 104 can consist of copper and can have a thickness of between about one nanometer and about ten nanometers, e.g., about five nanometers. In other examples, first buffer layer 104 can be provided as a multi-layer buffer layer, i.e., having alternating layers of different materials. Nonmagnetic spacer layer 112 can be included to separate the magnetic layers 110, 114 and can be fabricated, for example, of any one of elemental copper (Cu), elemental ruthenium (Ru), elemental iridium (Ir), or elemental rhodium (Rh). Spacer layer 112 can have a thickness of, for example, between about 2.5 nanometers and about 7.5 nanometers, e.g., between about 3.75 nanometers and about 6.25 nanometers, e.g., between about 4.5 nanometers and about 5.5 nanometers, e.g., about 5.0 nanometers. Second buffer layer 120, which can also be called a capping layer, can be included to prevent inner diffusion and as a smoothing layer, and can be fabricated, for example, of copper and can have a thickness of between about one nanometer and about ten nanometers, e.g., about five nanometers.

Magnetic bilayer 114, comprising second magnetic layer 116 and third magnetic layer 118, can be used to reference a binary state written to free magnetic layer 110. The use of a ferrimagnetic (FIM)/ferromagnetic (FM) exchange-biased bilayer structure as the fixed layer in an MJJ layer stack simultaneously improves the magnetic switching of a fixed-layer ferromagnetic (FM) layer and ultimately reduces interlayer coupling in a JMRAM device. Specifically, a $Gd_xFe_{1-x}$ binary alloy (e.g., $Gd_{50}Fe_{50}$) can be used to exchange-bias an FM material (e.g., $Ni_{80}Fe_{20}$) in a JMRAM device, as shown in any of FIGS. 1A-1D. The choice of FM/FIM materials is not limited to NiFe/GdFe bilayers. The ferrimagnetic material can be any 4f valence configured rare earth element paired with a 3d magnetic transition metal (e.g., FeGd, GdCo, DyCo, etc.).

Second magnetic layer 116 can thus be fabricated of any soft ferromagnetic material that can support the expected critical current, e.g., $Ni_{80}Fe_{20}$ binary or ternary alloys, $Co_xFe_yB_x$, $Co_xFe_{1-x}$. Second magnetic layer 116 can have a thickness of between about 0.5 nanometers and about two nanometers. Third magnetic layer 118 can be chosen from among the ferrimagnetic materials with the formula $RE_xTM_{1-x}$, where RE is a rare earth metal selected from among gadolinium (Gd), terbium (Tb), dysprosium (Dy), holmium (Ho), erbium (Er), or thulium (Tm), and TM is a ferromagnetic transition metal elected from among iron (Fe), nickel (Ni), or cobalt (Co), e.g., $Gd_xFe_{1-x}$, $Gd_xCo_{1-x}$, $Dy_xCo_{1-x}$, etc., where $0<x<1$. Third magnetic layer 118 can have a thickness of between about 0.5 nanometers and about two nanometers to maintain exchange coupling and critical current transparency. According to one set of examples, the second magnetic layer 116 is composed of 80:20 nickel-iron permalloy ($Ni_{80}Fe_{20}$) and has a thickness of between about one-half a nanometer and about two nanometers, e.g., about 1.6 nanometers, and the third magnetic layer 118 is composed of $Gd_xFe_{1-x}$ and has a thickness of between about one-half a nanometer and about two nanometers, e.g., about 1.6 nanometers. According to another set of examples, the second magnetic layer 116 is composed of $Ni_{80}Fe_{20}$ and has a thickness of between about one-half a nanometer and about two nanometers, e.g., about 1.6 nanometers, and the third magnetic layer 118 is composed of $Gd_xCo_{1-x}$ and has a thickness of between about one-half a nanometer and about two nanometers, e.g., about 1.6 nanometers.

First magnetic layer 110 can, for example, be made of 80:20 nickel-iron permalloy ($Ni_{80}Fe_{20}$ and can have a thickness of between about 0.5 nanometers and about two nanometers, e.g., about 1.6 nanometers. First magnetic layer 110 can also, for example, be made of any one of elemental nickel (Ni), elemental cobalt (Co), elemental iron (Fe), a cobalt-iron alloy (e.g., 1:1 CoFe), a nickel-iron binary alloy (NiFe), or a nickel-iron ternary alloy (e.g., NiFeCr). In the case of each alloy mentioned, many different alloy concentrations can be used, provided that the alloy concentration is magnetic and the magnetic layer maintains critical current transparency.

Figure 2C:
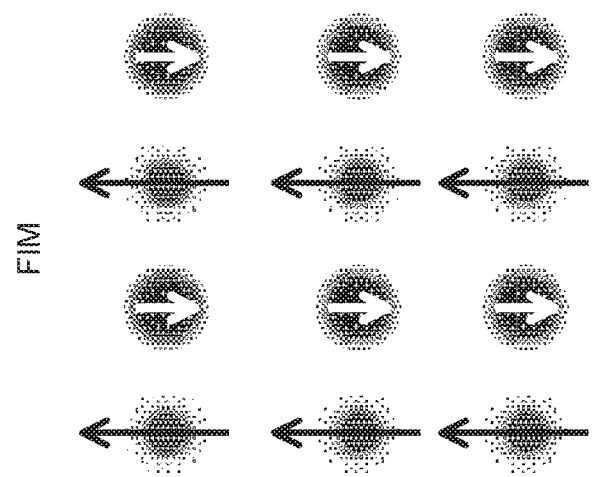
FIGS. 2A-2C are spin magnetic moment vector alignment diagrams for example ferromagnetic, antiferromagnetic, and ferrimagnetic materials, respectively.
Figure 2B:
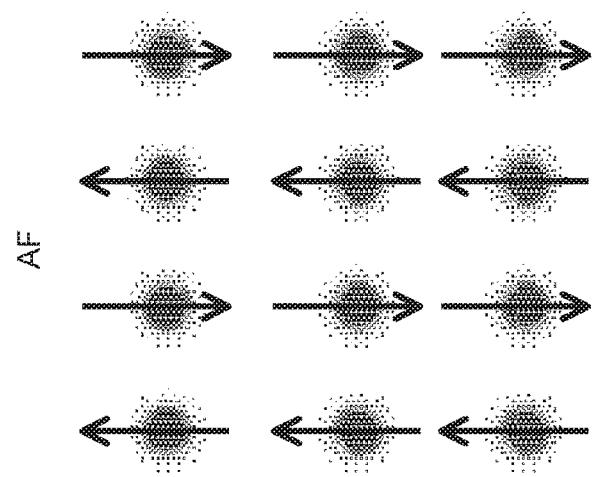
Figure 2A:
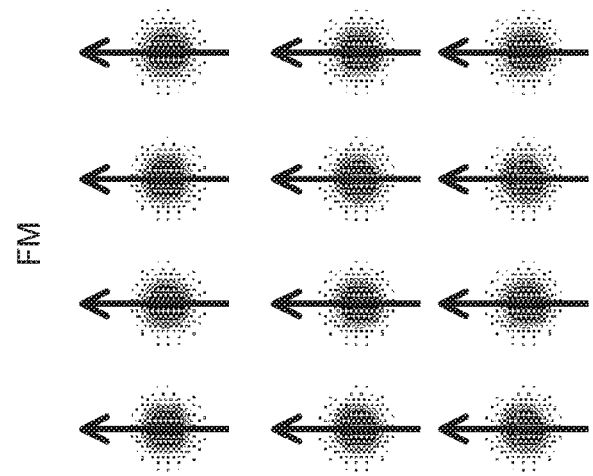

FIGS. 2A-2C show schematic representations providing general descriptions of three different classes of magnetic materials (i.e. antiferromagnetic, ferromagnetic and ferrimagnetic, respectively). The shaded circular areas represent atomic nuclei, whereas the arrows each represent a moment vector corresponding to the magnetic spin of each atomic nucleus. FIG. 2A illustrates an atomic spin representation of a ferromagnetic (FM) structure having a net spin magnetic moment greater than zero. FIG. 2B illustrates an atomic spin representation of an antiferromagnetic (AF) structure having antiparallel magnetic moments that cancel each other out to result in a net spin magnetic moment of zero. FIG. 2C illustrates an atomic spin representation of ferrimagnetic (FIM) structures, typically an alloy, as of a rare earth metal and a transition metal, (e.g., gadolinium iron), having uncompensated spins such that the net magnetic moment is greater than zero, but still with an antiparallel configuration of the moments.

FIM/FM bilayer structures can be used to exchange-bias a standard FM layer in device 100. The process of exchange-bias for a FIM/FM system is similar to an antiferromagnetic/ ferromagnetic (AF/FM) exchange-bias system, used for fixed layers in non-superconducting MRAM and magnetic hard drive recording heads. FIGS. 3A-3D illustrate the process of exchange bias of an AF/FM bilayer system. In each drawing, the direction of an applied field $H_{app}$ is indicated by an arrow above the bilayer diagram. Arrows within the individual layers in the bilayer system indicate directions of spin magnetic moments.

Figure 3A:
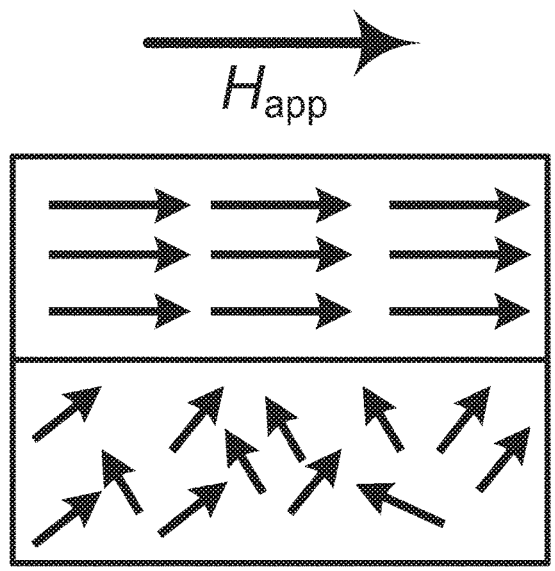
FIGS. 3A-3D are spin magnetic moment vector alignment diagrams showing the process of exchange bias of an example antiferromagnetic/ferromagnetic (AF/FM) bilayer system.

FIG. 3A shows an initial state of FM/AF layers in the applied magnetic field $H_{app}$. When the field $H_{app}$ is applied above the AF Néel temperature $T_N$, but below the FM Curie temperature $T_C$ (i.e., $T_N<T<T_C$), the FM spins orient parallel to the applied magnetic field, while the AF spins remain in a random configuration. Thus, the spin magnetic moments of the FM layer are aligned to the applied field $H_{app}$, but the spin magnetic moments of the AF layer may still all point in random directions.

Figure 3B:
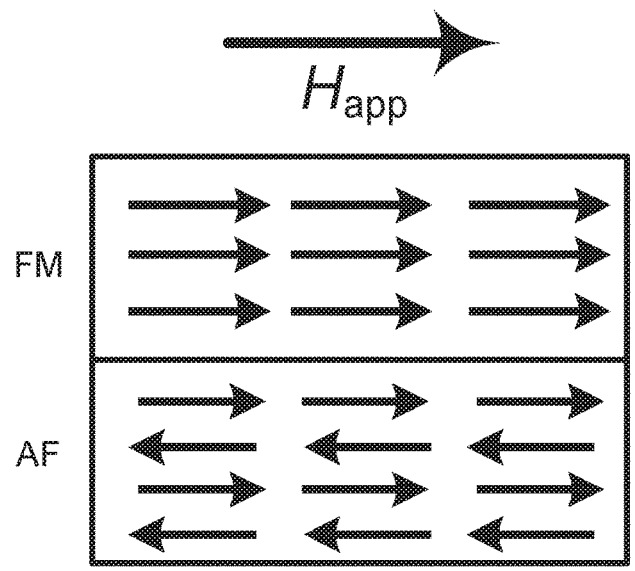

When the system is cooled below the Néel temperature $T_N$ in the applied magnetic field $H_{app}$, the AF spins align. FIG. 3B shows AF moments oriented antiparallel with respect to the applied field $H_{app}$ when the temperature is below the Néel temperature ($T<T_N$). At the interface between the FM layer and the AF layer, the spin magnetic moments are pointed in the same direction (i.e., the AF alignment is ferromagnetic at the AF/FM interface), indicating that the FM layer and the AF layer are magnetically coupled together.

Figure 3C:
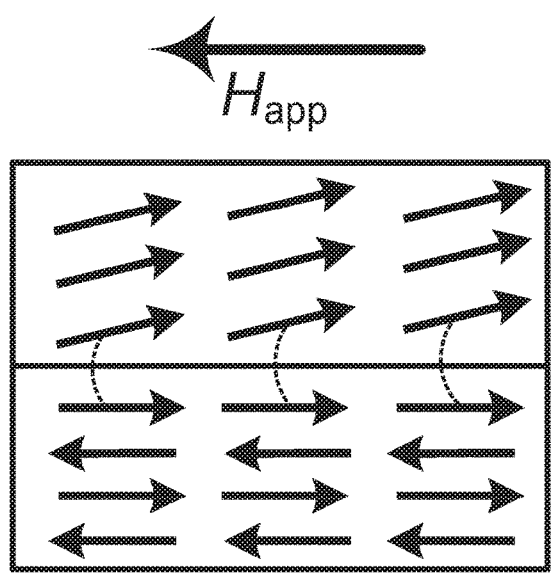
Figure 3D:
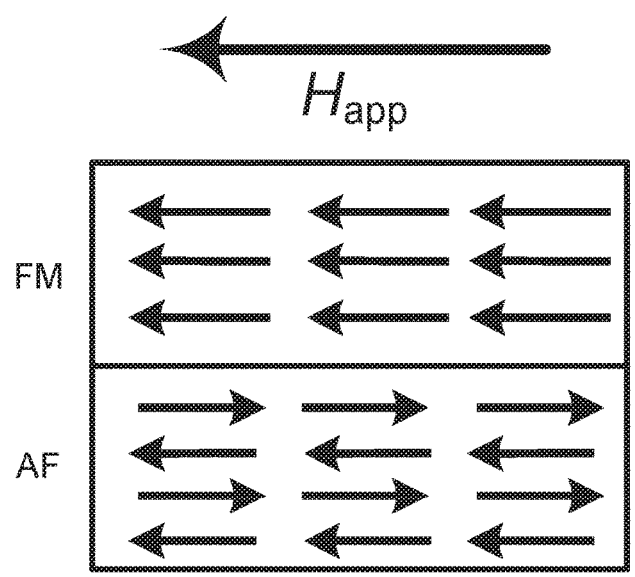

When the applied magnetic field is reversed, the FM spins rotate; however, the AF spins remain unchanged. The interfacial interaction between the AF/FM spins is such that the FM spins do not readily rotate, as shown in FIG. 3C, and a larger reversal field is required to completely reverse the FM layer and overcome the AF interactions, as shown in FIG. 3D. FIG. 3C illustrates the beginning of rotation of FM spins with reversal of the direction of the applied magnetic field $H_{app}$. However, strong AF/FM interfacial interactions, illustrated in the diagram as broken arcuate lines, cause this reversal field to be larger than in an FM layer alone. That is, because the FM spin magnetic moments are exchange-coupled to the AF layer, they are not able to energetically reverse as easily, meaning that a larger field $H_{app}$ has to be applied to achieve the reversal shown in FIG. 3D, which illustrates the FM spins completely reversed as the result of the larger applied reversal field $H_{app}$. How much bigger the applied reversal field $H_{app}$ has to be depends on the layer thicknesses and the material compositions of the layers.

Figure 4:
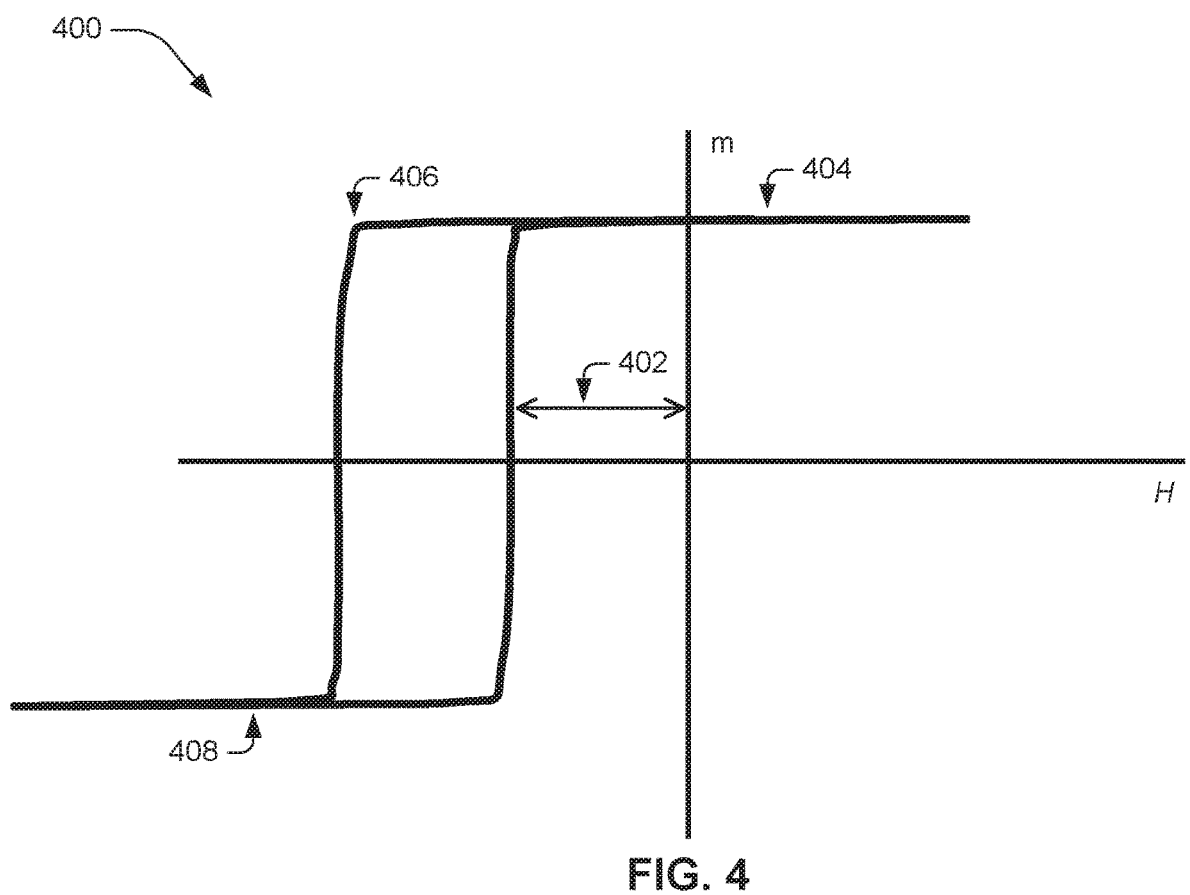
FIG. 4 is a graph of an example hysteresis loop for an AF/FM bilayer system like that of FIGS. 3A-3D.
Figure 5A:
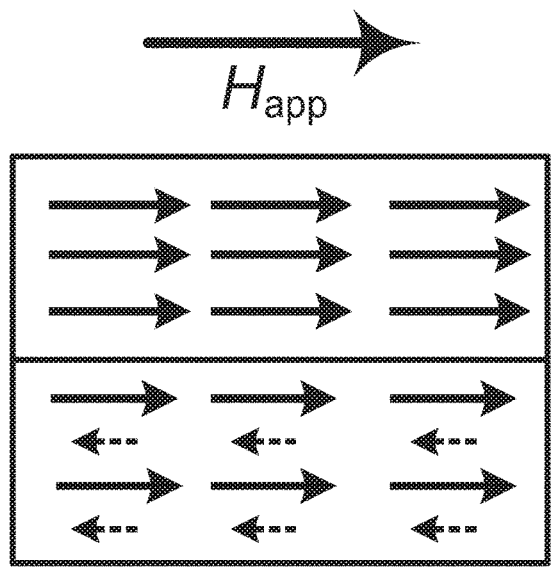
FIGS. 5A-5C are spin magnetic moment vector alignment diagrams showing the process of exchange bias of an example ferrimagnetic/ferromagnetic (FIM/FM) bilayer system.
Figure 5B:
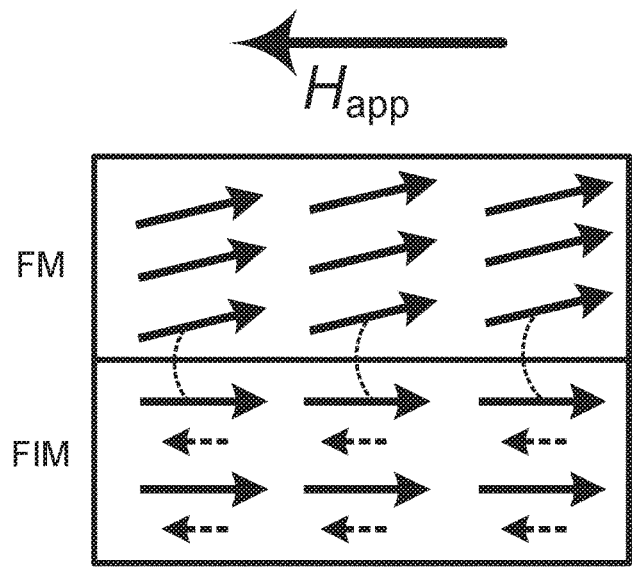
Figure 5C:
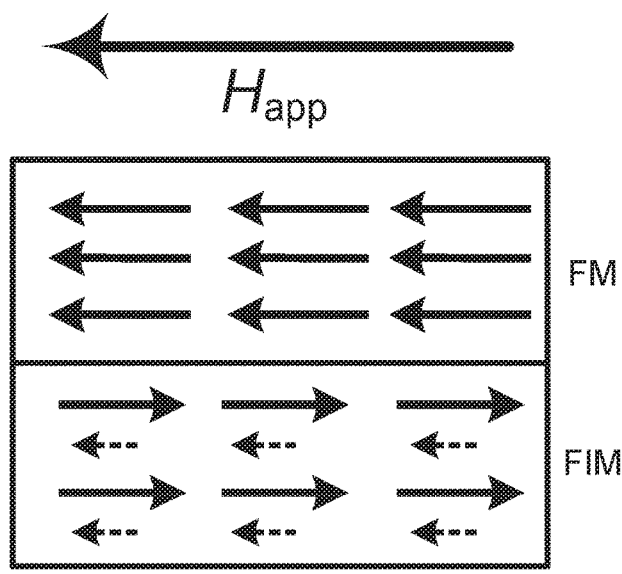

Ultimately, these interactions result in a characteristic loop shift on the field axis (i.e. exchange bias), as shown in FIG. 4. The general dynamic picture for an FIM/FM bilayer system as described herein is similar to the AF/FM exchange bias phenomena; however it is simplified, as a field cooling step is no longer necessary, as shown in FIGS. 5A-5C. FIG. 4 illustrates a hysteresis loop 400, which can also be termed a magnetic reversal loop, having a hysteresis offset 402 for an AF/FM bilayer system like that illustrated in FIGS. 3A-3D, with points 404, 406, and 408 corresponding to the diagrams in FIGS. 3B, 3C and 3D, respectively. The vertical axis represents magnetic moment m in units of, for example, ergs per gauss. Because the energy of the applied field $H_{app}$ required for reversal in the AF/FM system is higher, loop 400 is shifted leftward from the origin by the amount indicated by offset 402. Without the bilayer structure, i.e., using only a single layer, the loop would be effectively centered around the origin. The extent of offset 402 can improve switching performance in the device incorporating the bilayer system.

FIGS. 5A-5C illustrate the process of exchange bias of a ferrimagnetic/ferromagnetic (FIM/FM) bilayer system. FIG. 5B shows FM spins beginning to rotate with reversal of $H_{app}$, however FIM/FM interfacial interactions cause this reversal field to be larger than the reversal field of an FM layer alone. FIG. 5C shows FM spins completely reversed. A portion of the FIM material needs significantly higher fields to reverse (spin flip transition).

Figure 6A:
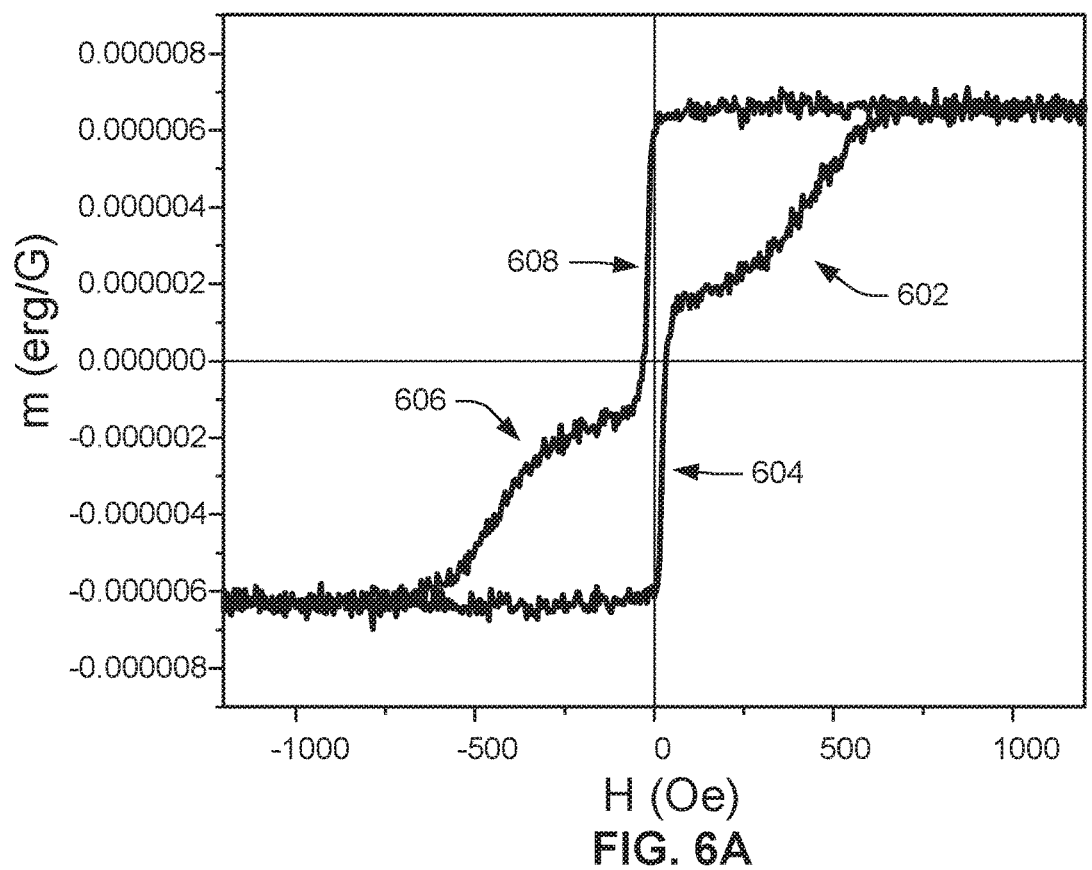
FIGS. 6A and 6B are graphs of example hysteresis loops for a magnetic Josephson junction not using the FIM/FM bilayer of the FIMJJ device described herein.

When implemented, for example, in a JMRAM system, the FIMJJ stack structure 100 shown in FIG. 1A (or structure 150, 152, or 154 shown in any of FIGS. 1B-1D) has switching advantages over an MJJ comprising superconductor contact layers (e.g., niobium (Nb)) sandwiching a fixed FM layer (e.g., nickel (Ni)), with a high coercivity $H_{cfixed}$, and a free FM layer (e.g., 80:20 nickel-iron ($Ni_{80}Fe_{20}$)), with a low coercivity $H_{cfree}$, separated by a normal non-magnetic metal (NM) (e.g., copper (Cu)). FIG. 6A shows a hysteresis loop of such an MJJ stack. Use of a single ferromagnet (e.g., nickel) as a fixed layer in the MJJ stack poses disadvantages that make it unsuitable as a long-term memory solution. These issues include (but are not limited to) broad switching distributions, high initialization fields, no easy/hard axis anisotropy, the tendency of nickel magnetization to orient itself perpendicular to the film plane at low thicknesses, and magnetostatic/interlayer magnetic coupling. The use of FM/FIM exchange bias and the ability to modify the magnetic hysteresis, using the materials and devices as described herein, leads to an improved route for a hard FM layer and reduction of the severity of the listed issues, thus enabling a more scalable and reliable magnetic memory with minimal cost and materials impacts.

Using a ferrimagnetic material to exchange bias the FM layer provides a pathway for a more reliable fixed magnetic layer in the MJJ stack. Such a configuration may specifically reduce coupling fields to the free magnetic layer and improve overall reliability. Furthermore, FIM materials such as gadolinium iron (GdFe) have a lower resistivity compared to conventional AF materials such as iron manganese (IrMn) or platinum manganese (PtMn). The lower resistive material provides an advantage since resistivity directly limits superconducting critical current through a layer via the proximity effect.

Thus, FIG. 6A shows the magnetic reversal process of a patterned elliptical MJJ JMRAM device sized at one micrometer by two micrometers in the plan view, at a temperature of ten kelvins. The graph shows a nickel fixed magnetic layer switching at about four hundred oersteds and a nickel-iron free magnetic layer switching at about fifteen oersteds. Even though two different layers are used, the nickel layer still effectively couples across the bit-pillar and causes the nickel-iron layer to switch with it.

Figure 6B:
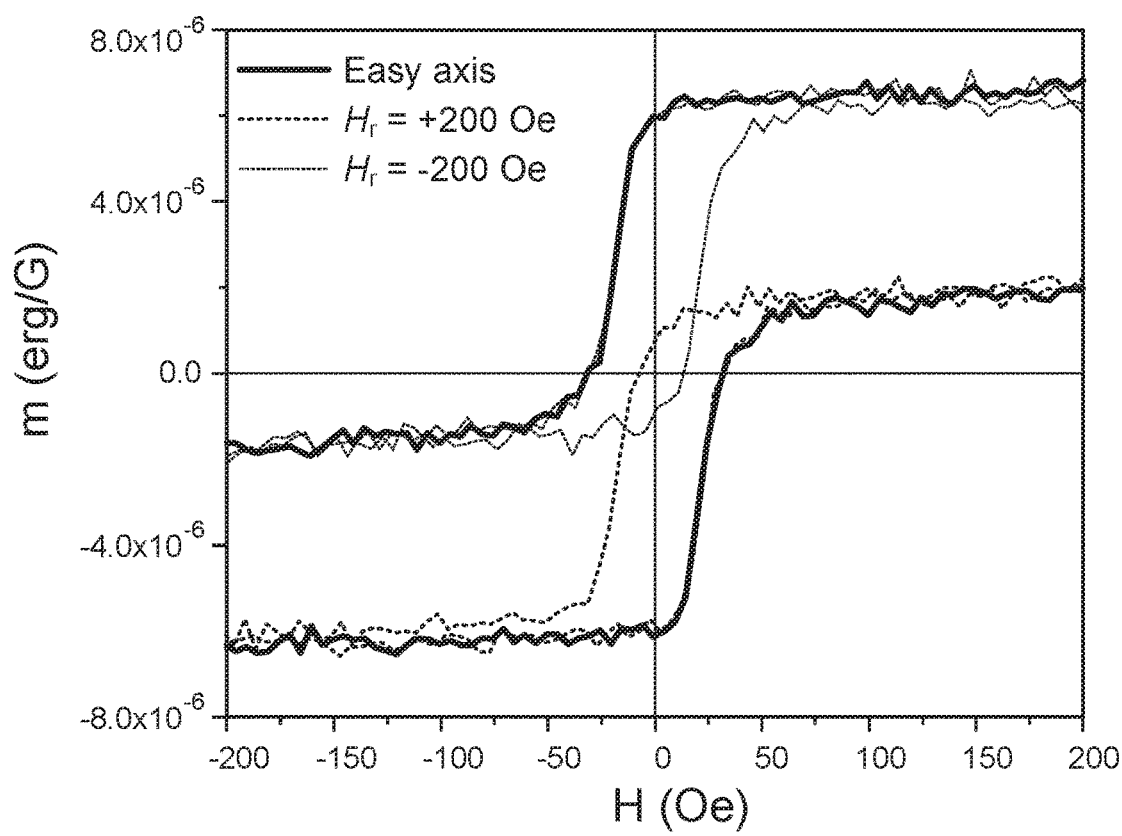

The minor hysteresis loop measurements of FIG. 6B illustrate the strength at which a nickel fixed magnetic layer couples to a nickel-iron free magnetic layer in an MJJ by showing a shift in the minor loop of the magnetic stack, which ultimately provides a measure of the field exerted by the nickel fixed magnetic layer on the $Ni_{80}Fe_{20}$ free magnetic layer and shows that dipolar coupling dominates in this film structure. The thicker solid-line plot is the major hysteresis loop shown in FIG. 6A, whereas the broken-line plots represent minor sweeps, with the applied magnetic field going from positive 200 oersteds to negative 200 oersteds and back (medium-thickness broken-line plot) or vice-versa (thinner broken-line plot). Each line in each plot corresponds to a sweep direction. The reversal field $H_r$ in the legend of FIG. 6B indicates the starting point of the measurement: the thinner broken-line plot starts at negative 200 oersteds and sweeps up to positive 200 oersteds, whereas the medium-thickness broken-line plot starts at positive 200 oersteds and sweeps down to negative 200 oersteds.

Each of the minor sweeps in FIG. 6B examine just one of the MJJ magnetic layers switching without the influence of the other layer, for example, by setting the nickel fixed magnetic layer magnetization direction and holding it there, so as to examine only the switching of the nickel-iron free magnetic layer. Thus, for example, examining the switching of only the nickel-iron free magnetic layer provides information about the impact of the nickel fixed magnetic layer on the switching of the nickel-iron free magnetic layer. The fact that the broken-line minor-loop plots do not overlap completely with the solid-line major-loop plot indicates that the nickel fixed magnetic layer drags the nickel-iron free magnetic layer, such that the free magnetic layer is not switching freely. The FIMJJ materials and devices described herein address this issue by providing the ferrimagnetic layer to, in effect, hold the fixed magnetic layer in place while switching the free magnetic layer back and forth, thus ameliorating the rounding effects 602, 606 in the major hysteresis loop. Shoulder shape 606, for example, is pushed out from the inner region near the graph origin, so that the inner region 608 can switch easier. Accordingly, switching between the states is sharpened so as to reduce bit errors in a memory constructed using the FIMJJ.

Figure 7A:
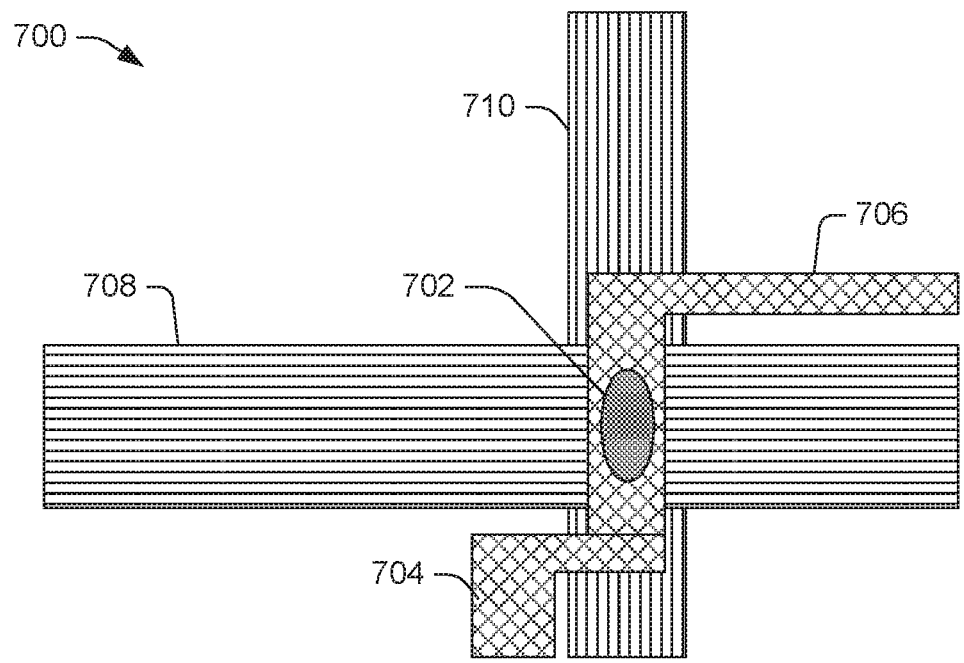
FIG. 7A is a plan view of an example FIMJJ-based memory element including current wires and magnetization write lines.
Figure 7B:
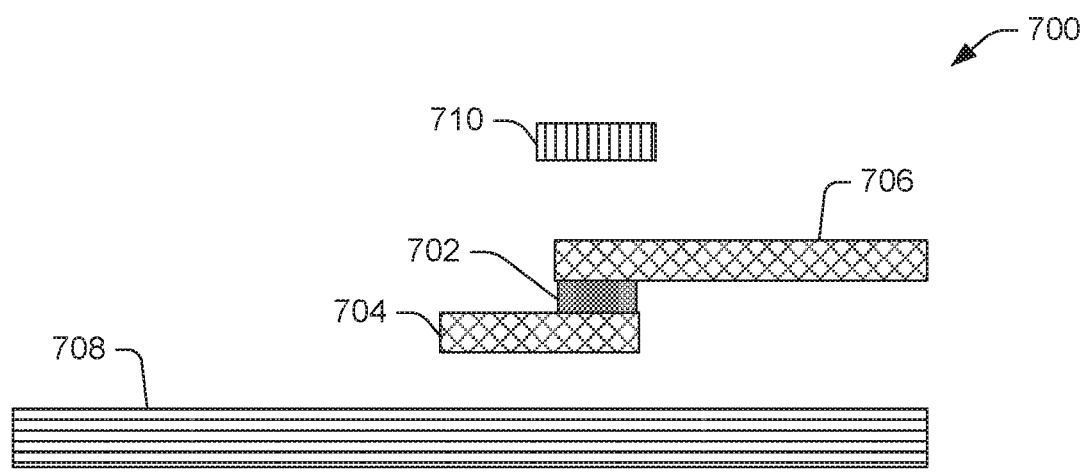
FIG. 7B is a cross-section view of the example FIMJJ-based memory element of FIG. 7A.

FIGS. 7A and 7B respectively show plan and cross-sectional views of a memory element 700 that can be implemented in an integrated circuit (IC) chip and can include a FIMJJ device 702 that can correspond, for example, to FIMJJ device 100 of FIG. 1A (or structure 150, 152, or 154 shown in any of FIGS. 1B-1D). Thus, memory element 700 can have a number of layers, including magnetic layers, one of which can be a ferrimagnetic layer. In addition to FIMJJ 702, memory element 700 can also include current-in wire 704 and current-out wire 706 by which memory element 700 can be connected to other parts of a circuit in which memory element 700 is integrated, e.g., on an IC, such as a memory unit cell, like that illustrated in FIG. 8. Thus, for example, current-in wire 704 can be galvanically connected to or can include one of layers 102, 122 in the device 100 of FIG. 1A (or device 150, 152, or 154 shown in any of FIGS. 1B-1D), while current-out wire 706 can be galvanically connected to or can include the other of layers 102, 122. Wires 704, 706 can each be fabricated, for example, from a superconducting metal, e.g., niobium, niobium nitride, or aluminum.

Memory element 700 can also include word write line 708 and bit write line 710 for writing a binary state to device 702.

Write lines 708, 710 can be inductively coupled to the free magnetic layer device 702 to enable controlled switching of the free magnetic layer between a state in which its magnetization is parallel to that of the fixed magnetic layer and a state in which its magnetization is antiparallel to that of the fixed magnetic layer. Thus, establishing a current through word write line 708 and through bit write line 710 in turn generates a magnetic field that will induce the magnetization direction of the free magnetic layer to reverse, which reversal remains even when the magnetic field is removed, e.g., by the cessation of current through write lines 708, 710. In contrast, the fixed layer is only affected while the magnetic field is active. Once the fields are turned off, the fixed magnetic layer returns to its original configuration. The magnetic fields generated by write lines 708, 710 are configured so as not to be high enough to drive a switch in the fixed magnetic layer. Sequential activation of the write lines can be configured to force the free magnetic layer to orient in its hard axis direction prior to tipping the magnetization into a desired direction, in a process known as high hard axis switching.

In the plan view of FIG. 7A, looking down on and normal to a transverse plane of memory element 700, bit write line 710 is illustrated as "below" other components 702, 704, 706, 708 for illustration purposes, but bit write line 710 can be "above" the other components as shown in the cross-sectional view of FIG. 7B, which looks in on and normal to a longitudinal plane of memory element 700.

In JMRAM applications, controlled DC currents are used to write states to magnetic cells in an array. On layers above and/or below the pillar 702 are a word write line 708 and a bit write line 710 forming a cross-point memory cell. When a current is sent down both of the lines, a large enough field is produced where the lines intersect to switch the bit, i.e., to change the parallel or antiparallel state of the magnetic layers of the FIMJJ device 702. Writing a state can thus involve putting a supercurrent through both lines 708, 710, switching the free layer, whereas reading a written state can involve sending a supercurrent through the superconducting-material contacts 704, 706 at the top and bottom of FIMJJ device 702, which can be connected to a superconducting quantum interference device (SQUID) configured to sense the phase of the FIMJJ. The magnitude of the supercurrent, if high enough to exceed the critical current of one of the Josephson junctions in the SQUID and thereby to trigger one of the Josephson junctions in the SQUID, results in a voltage pulse being propagated, on a bit read line, representing, e.g., a logical "1," whereas if the magnitude of the supercurrent is insufficiently high, due to an antiparallel orientation of the magnetic layers in the FIMJJ, no such voltage pulse is propagated, corresponding, e.g., to a logical "0."

Figure 8:
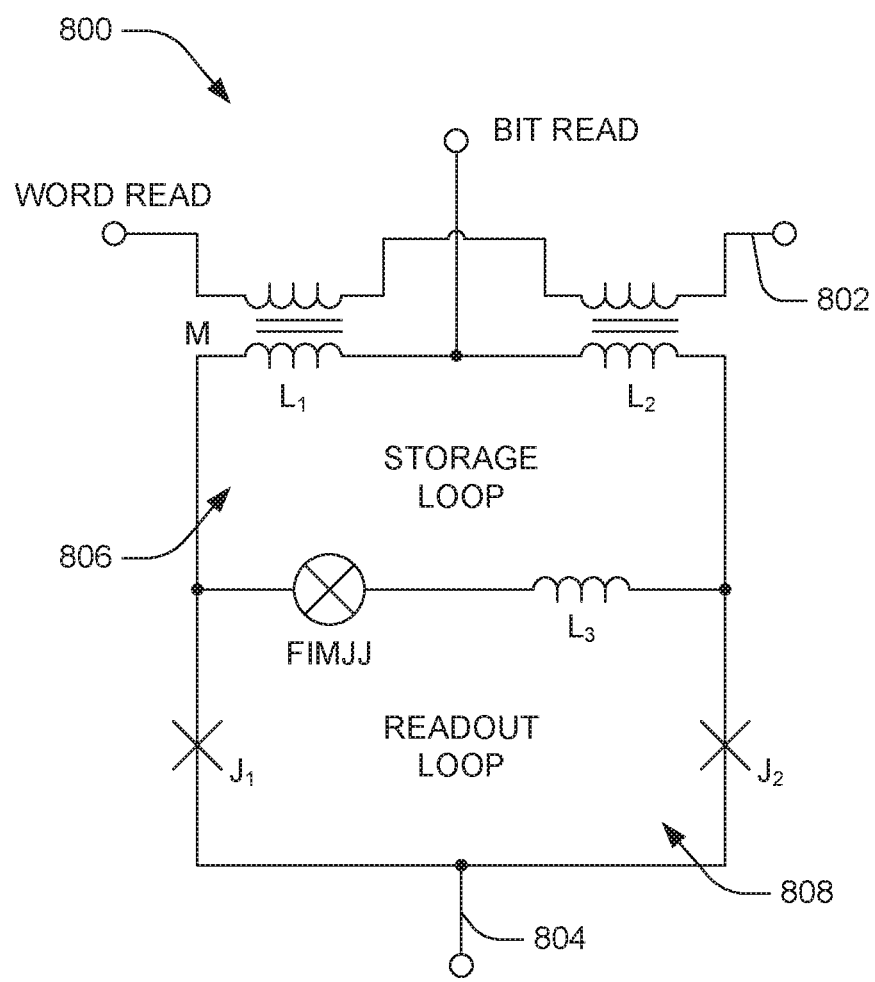
FIG. 8 is a circuit diagram of an example memory unit cell that includes an FIMJJ device.

FIG. 8 is a circuit schematic of an example JMRAM unit cell 800, including an rf-SQUID storage loop 806 and a direct-current dc-SQUID readout loop 808, and omitting write lines for simplicity of illustration. The storage loop 806 contains an FIMJJ that can correspond, for example, to device 100 of FIG. 1A (or device 150, 152, or 154 shown in any of FIGS. 1B-1D) or 700 of FIGS. 7A-7B, as well as inductors $L_1$, $L_2$, and $L_3$. Current provided through word read line 802 applies flux to a selected memory cell such that the current through bit read line 804 exceeds the readout SQUID critical current in one memory state, but not in the other. The storage loop 806 that encloses a spontaneously generated flux $\Phi_0/2$ when the FIMJJ is in a $\pi$ state and zero flux otherwise. The loop linear inductance is greater than the Josephson inductance of the FIMJJ. A portion of the stored flux is coupled into the dc-SQUID readout loop 808 and can be sensed by passing a bit-read current through bit read line 804. A word-read current through word read line 802 tunes the dc-SQUID flux such that in the memory state associated with an FIMJJ $\pi$ phase ($\Phi_0/2$ in the storage loop 806), the bit-read current causes the dc-SQUID to switch to its voltage state. In the other memory state, which is associated with an FIMJJ zero phase, the dc-SQUID critical current is higher than the bit-read current and the dc-SQUID remains in the zero-voltage state.

Figure 9:
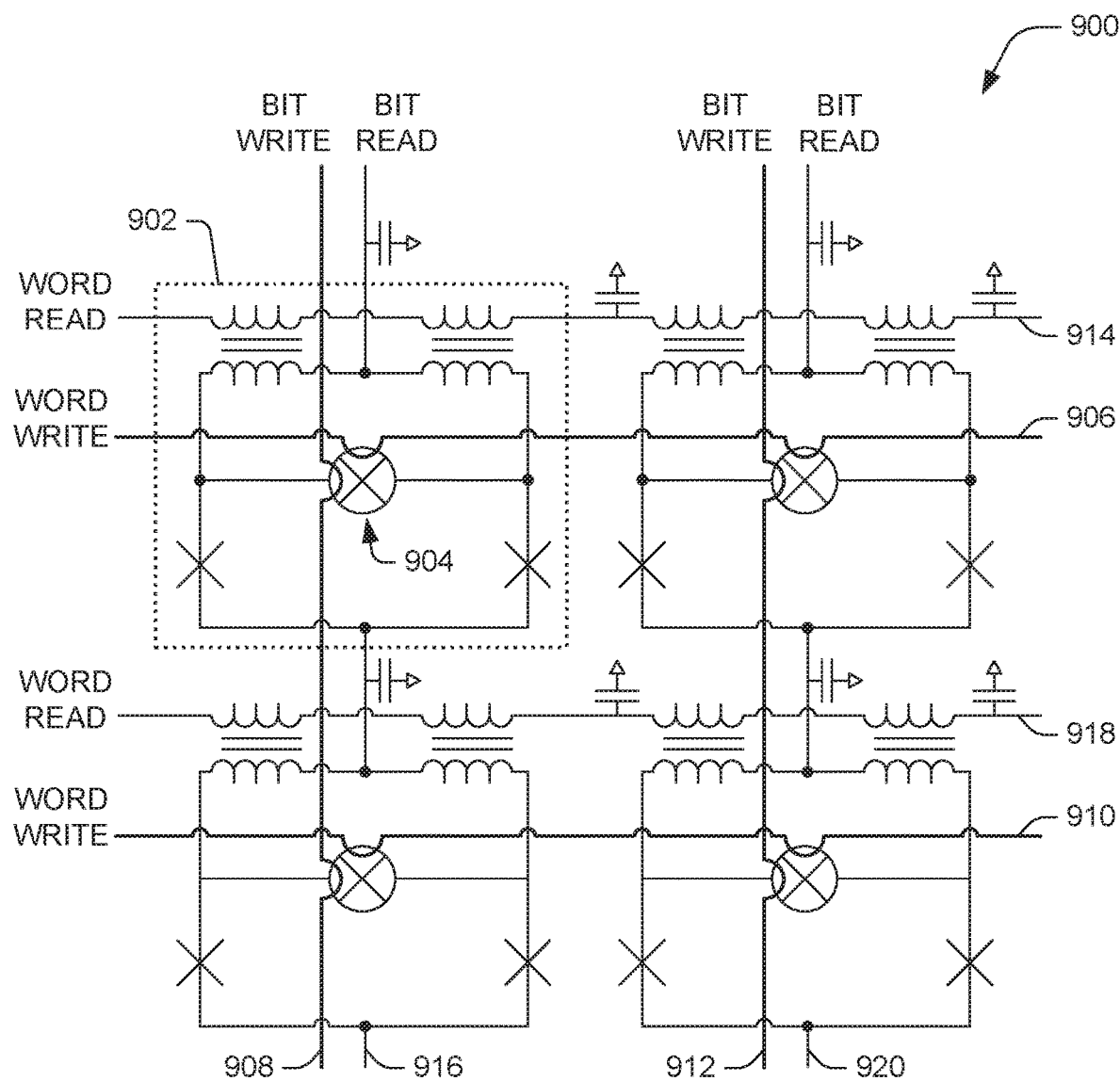
FIG. 9 is a circuit diagram of an example memory array incorporating FIMJJ devices.

FIG. 9 shows how unit cells 902, like unit cell 800 of FIG. 8, can be tiled to form an x-y addressable memory array 900, with word write lines 906, 910 and bit write lines 908, 912 applying hard- and easy-axis fields to each FIMJJ 904. Read lines 914, 918, 916, 920 use the cell inductance to form LC ladder transmission lines for fast signal propagation. Although only a 2×2 memory array is shown, larger memory arrays can be patterned similarly to create memories of arbitrary size.

The materials and devices described herein improve the magnetic switching of a magnetic thin-film material to be used as a fixed (magnetically hard) layer in a JMRAM junction in a way that is compatible with maintaining high critical currents through the junction. The present disclosure further includes a method of fabricating the materials and devices described herein, consisting of depositing in order the layers shown in any of FIGS. 1A-1D as described above with respect to FIGS. 1A-1D to build up the illustrated layer stack, or depositing the layers with the first magnetic layer 110 above the spacer layer 112 and the bilayer 114 below the space layer 112, as previously described.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A magnetic Josephson junction (MJJ) device comprising:
   a first superconducting material layer and a second superconducting material layer each configured as a galvanic contact for the device on respective top and bottom ends of the device;
   a first magnetic layer and a magnetic bilayer comprising a second magnetic layer and an adjacent third magnetic layer, both the first magnetic layer and the magnetic bilayer being located between the first and second superconducting material layers, the third magnetic layer being a ferrimagnet; and
   a normal metal spacer layer between the first magnetic layer and the magnetic bilayer;
   wherein the MJJ device is configured to store a binary logical value as a magnetic orientation of the first magnetic layer with reference to the magnetic orientation of the second magnetic layer.

2. The device of claim 1, wherein the second magnetic layer has a thickness of between about 0.5 nanometers and about two nanometers and is selected from one of $Ni_{80}Fe_{20}$ binary or ternary alloys, $CO_xFe_yB_x$, $CoxFe_{1-x}$ and wherein the ferrimagnet has a thickness of between about 0.5 nanometers and about two nanometers and is of the formula $RE_xTM_{1-x}$, where RE is a rare earth metal selected from among gadolinium (Gd), terbium (Tb), dysprosium (Dy), holmium (Ho), erbium (Er), or thulium (Tm), and TM is a ferromagnetic transition metal selected from among iron (Fe), nickel (Ni), or cobalt (Co), where $0<x<1$.

3. The device of claim 2, wherein the first magnetic layer is configured as a magnetic switching layer, has a thickness of between about 0.5 nanometers and about two nanometers, and is made of any of elemental cobalt, elemental iron, a cobalt-iron alloy, a nickel-iron alloy, or a nickel-iron-chromium alloy.

4. The device of claim 3, wherein the first ferromagnetic layer is a nickel-iron 80:20 permalloy.

5. The device of claim 2, wherein the second magnetic layer is a $Ni_{80}Fe_{20}$ layer and wherein the ferrimagnet is a $Gd_xFe_{1-x}$ layer.

6. The device of claim 2, wherein the second magnetic layer is a $Ni_{80}Fe_{20}$ layer and wherein the ferrimagnet is a $Gd_xCo_{1-x}$ layer.

7. The device of claim 1, wherein the first superconducting material layer has a thickness of between about one hundred nanometers and about two hundred nanometers, and wherein the second superconducting material layer has a thickness of between about twenty nanometers and about one hundred nanometers, and wherein the first and second superconducting material layers are of niobium, niobium nitride, or aluminum.

8. The device of claim 1, wherein the spacer layer is made of at least one of elemental copper, elemental ruthenium, elemental iridium, or elemental rhodium.

9. The device of claim 8, wherein the spacer layer has a thickness of between about 2.5 nanometers and about 7.5 nanometers.

10. A superconducting memory element comprising the MJJ device of claim 1, and further comprising an easy axis field line and a hard axis field line that are each inductively coupled to the first magnetic layer to provide controlled switching of the MJJ device between a state in which the magnetization of the first magnetic layer is parallel with the magnetization of the second magnetic layer and a state in which the magnetization of the first magnetic layer is antiparallel with the magnetization of the second magnetic layer, thereby writing a binary state to the MJJ device detectable as a difference in superconducting phase of the MJJ device.

11. A superconducting memory unit cell comprising the superconducting memory element of claim 10, the superconducting memory unit cell comprising:
an rf-SQUID storage loop comprising first and second inductors and the superconducting memory element, the first and second inductors being transformer-coupled to a superconducting word read line,
a dc-SQUID readout loop comprising first and second Josephson junctions and the superconducting memory element, the readout loop being galvanically connected to a bit read line.

12. A superconducting memory array comprising multiple instances of the superconducting memory unit cell of claim 11 arranged in rows and columns, with multiple word write lines and bit write lines respectively provided to the superconducting memory elements of the superconducting memory unit cell instances to addressably write binary logical states to the individual superconducting memory elements, and with word read lines and bit read lines provided to the superconducting memory unit cell instances to addressably read the binary logical states.

13. A superconducting memory element comprising:
first and second superconducting wires providing galvanic input and output to the memory element;
first and second field lines providing inductive memory state write input to the memory element;
a magnetic Josephson junction (MJJ) arranged between and connecting the first and second superconducting wires, the MJJ having a free ferromagnetic layer and a fixed ferromagnetic layer that together can occupy one of a parallel or antiparallel magnetization configuration corresponding to a binary logic state, the MJJ having a ferrimagnetic layer adjacent to and magnetically coupled to the fixed ferromagnetic layer.

14. The superconducting memory element of claim 13, wherein the fixed ferromagnetic layer has a thickness of between about 0.5 nanometers and about two nanometers and is selected from one of $Ni_{80}Fe_{20}$ binary or ternary alloys, $Co_xFe_yB_x$, or $Co_xFe_{1-x}$, and wherein the ferrimagnetic layer has a thickness of between about 0.5 nanometers and about two nanometers and is of the formula $RE_xTM_{1-x}$, where RE is a rare earth metal selected from among gadolinium (Gd), terbium (Tb), dysprosium (Dy), holmium (Ho), erbium (Er), or thulium (Tm), and TM is a ferromagnetic transition metal selected from among iron (Fe), nickel (Ni), or cobalt (Co), where $0<x<1$.

15. The superconducting memory element of claim 13, wherein the fixed ferromagnetic layer is a $Ni_{80}Fe_{20}$ layer and wherein the ferrimagnetic layer is a $Gd_xFe_{1-x}$ layer.

16. The superconducting memory element of claim 13, wherein the fixed ferromagnetic layer is a $Ni_{80}Fe_{20}$ layer and wherein the ferrimagnetic layer is a $Gd_xCo_{1-x}$ layer.

17. A method of fabricating an improved magnetic Josephson junction comprising:
depositing a base electrode layer of a superconducting material;
depositing a first buffer layer on top of the base electrode layer;
depositing one of a switching magnetic layer comprising a first magnetic layer or a fixed magnetic layer comprising a magnetic bilayer on top of the first buffer layer, wherein the first magnetic layer comprises a ferromagnetic material and the magnetic bilayer comprises a ferromagnetic material layer and a ferrimagnetic material layer;
depositing a spacer layer on top of the switching magnetic layer or the fixed magnetic layer;
depositing the other of the switching magnetic layer or the fixed magnetic layer on top of the spacer layer;
depositing a second buffer layer on top of the other of the switching magnetic layer or the fixed magnetic layer; and
depositing a top electrode layer of a superconducting material on top of the second buffer layer.

18. The method of claim 17, wherein the ferromagnetic material layer of the magnetic bilayer has a thickness of between about 0.5 nanometers and about two nanometers and is selected from one of $Ni_{80}Fe_{20}$ binary or ternary alloys, $Co_xFe_yB_x$, or $Co_xFe_{1-x}$, and wherein the ferrimagnetic material layer of the magnetic bilayer has a thickness of between about 0.5 nanometers and about two nanometers and is of the formula $RE_xTM_{1-x}$, where RE is a rare earth metal selected from among gadolinium (Gd), terbium (Tb), dysprosium (Dy), holmium (Ho), erbium (Er), or thulium (Tm), and TM is a ferromagnetic transition metal selected from among iron (Fe), nickel (Ni), or cobalt (Co), where $0<x<1$.

19. The method of claim 18, wherein the first ferromagnetic material layer of the magnetic bilayer is a $Ni_{80}Fe_{20}$ layer and wherein the ferrimagnetic material layer of the magnetic bilayer is a $Gd_xFe_{1-x}$ layer.

20. The method of claim 18, wherein the first ferromagnetic material layer of the magnetic bilayer is a $Ni_{80}Fe_{20}$ layer and wherein the ferrimagnetic material layer of the magnetic bilayer is a $Gd_xCo_{1-x}$ layer.

* * * * *